United States Patent
Chen et al.

(10) Patent No.: US 10,354,913 B2
(45) Date of Patent: Jul. 16, 2019

(54) CHEMICAL CLEAN OF SEMICONDUCTOR DEVICE

(71) Applicant: Taiwan Semiconductor Manufacturing Company, Ltd., Hsinchu (TW)

(72) Inventors: Nai-Chia Chen, Hsinchu (TW); Chun-Li Chou, Jhubei (TW); Yen-Chiu Kuo, Tainan (TW); Chun-Hung Chao, Hsinchu (TW); Yu-Li Cheng, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/801,179

(22) Filed: Nov. 1, 2017

(65) Prior Publication Data
US 2018/0350664 A1    Dec. 6, 2018

Related U.S. Application Data

(60) Provisional application No. 62/513,190, filed on May 31, 2017.

(51) Int. Cl.
*H01L 21/768* (2006.01)
*H01L 21/02* (2006.01)
(Continued)

(52) U.S. Cl.
CPC ........ *H01L 21/76814* (2013.01); *B08B 3/024* (2013.01); *B08B 3/08* (2013.01); *H01L 21/02063* (2013.01); *H01L 21/76849* (2013.01); *H01L 21/76877* (2013.01); *H01L 23/5226* (2013.01); *H01L 23/5283* (2013.01); *H01L 21/02101* (2013.01); *H01L 21/31116* (2013.01); *H01L 21/31144* (2013.01)

(58) Field of Classification Search
CPC ........... H01L 21/02101; H01L 21/0257; H01L 21/67028; H01L 21/02041; H01L 21/02052
See application file for complete search history.

(56) References Cited

U.S. PATENT DOCUMENTS

| | | | | |
|---|---|---|---|---|
| 5,783,495 A | * | 7/1998 | Li | ............................ C09K 13/06 134/1.3 |
| 6,399,552 B1 | * | 6/2002 | Lee | ............................ C11D 7/06 134/3 |

(Continued)

FOREIGN PATENT DOCUMENTS

| | | |
|---|---|---|
| DE | 102014209461 A1 | 11/2014 |
| JP | 2003142441 A | 5/2003 |

(Continued)

*Primary Examiner* — Zandra V Smith
*Assistant Examiner* — John M Parker
(74) *Attorney, Agent, or Firm* — Slater Matsil, LLP (57) ABSTRACT

A method of forming a semiconductor device includes forming a conductive feature in a first dielectric layer, forming one or more dielectric layers over the first dielectric layer, and forming a via opening in the one or more dielectric layers, a bottom of the via opening exposing the conductive feature. The method further includes cleaning the via opening using a chemical mixture, and rinsing the via opening using basic-ion doped water after cleaning the via opening.

20 Claims, 9 Drawing Sheets

(51) Int. Cl.
*H01L 23/528* (2006.01)
*B08B 3/02* (2006.01)
*B08B 3/08* (2006.01)
*H01L 23/522* (2006.01)
*H01L 21/311* (2006.01)

(56) References Cited

U.S. PATENT DOCUMENTS

| | | | | |
|---|---|---|---|---|
| 6,998,352 | B2* | 2/2006 | Aoki | C11D 7/265 257/E21.577 |
| 7,253,094 | B1* | 8/2007 | Zhang | H01L 21/02063 257/E21.309 |
| 2002/0115284 | A1* | 8/2002 | Wu | C23F 1/30 438/637 |
| 2003/0087524 | A1 | 5/2003 | Aoki et al. | |
| 2004/0051153 | A1* | 3/2004 | Yamamoto | H01L 21/28044 257/412 |
| 2004/0259374 | A1 | 12/2004 | Yasuda | |
| 2007/0269981 | A1* | 11/2007 | Lavoie | H01L 21/28562 438/678 |
| 2008/0045013 | A1* | 2/2008 | Lavoie | H01L 21/28562 438/687 |
| 2009/0308413 | A1 | 12/2009 | Freer et al. | |
| 2010/0018029 | A1* | 1/2010 | Chan | H01L 21/67046 29/592.1 |
| 2012/0161138 | A1* | 6/2012 | Okumoto | H01L 29/66742 257/59 |
| 2014/0349479 | A1 | 11/2014 | Mieth et al. | |
| 2015/0132948 | A1* | 5/2015 | Kuo | H01L 21/67219 438/666 |
| 2015/0200089 | A1* | 7/2015 | Suen | H01L 21/28079 438/592 |
| 2017/0084480 | A1 | 3/2017 | Mizutani et al. | |

FOREIGN PATENT DOCUMENTS

JP 2005033182 A 2/2005
KR 20070072385 A 7/2007

* cited by examiner

CHEMICAL CLEAN OF SEMICONDUCTOR DEVICE

PRIORITY CLAIM AND CROSS-REFERENCE

This application claims the priority of U.S. Provisional Patent Application No. 62/513,190 filed on May 31, 2017, entitled "Chemical Clean of Semiconductor Device," which application is hereby incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

In semiconductor manufacturing, vias are formed in the Back-End-Of-Line (BEOL) processing for a semiconductor device as part of an interconnect structure to connect various conductive features (e.g., conductive lines) formed in different layers (e.g., inter-metal dielectric layers) of the semiconductor device. Vias may be formed by etching the dielectric layer(s) to form via openings first, cleaning the via openings, then filling the via openings with conductive material(s) such as copper, tungsten, or other suitable conductive material. However, manufacturing of the vias has problems that need to be addressed.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of forming a semiconductor device, and in particular, in the context of cleaning and rinsing of via openings for forming vias of a semiconductor device. However, one skilled in the art will readily appreciate that the methods disclosed in the present disclosure may be used in other applications or for forming other structures, e.g., for reducing copper recess during the cleaning process and/or the rinsing process in the formation of conductive structures other than vias.

Figure 1:
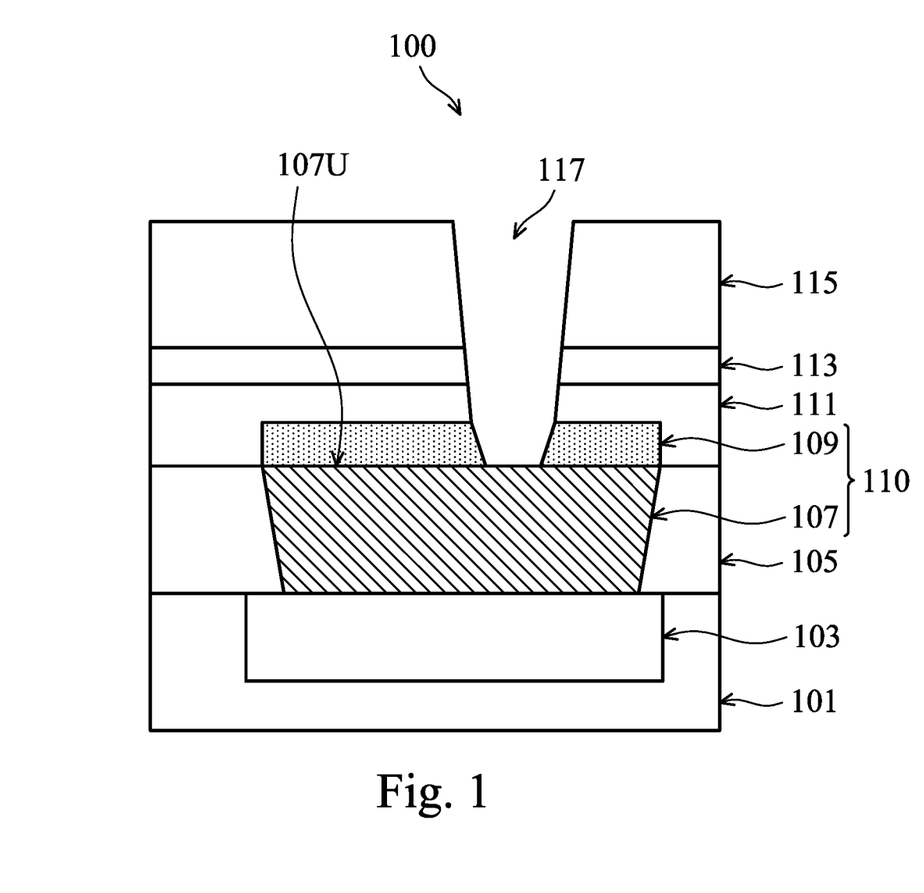
FIG. 1 illustrates a cross-sectional view of a semiconductor device at a stage of fabrication, in accordance with an embodiment.

With reference now to FIG. 1, FIG. 1 illustrates a semiconductor device 100 at a stage of fabrication. As illustrated in FIG. 1, the semiconductor device 100 comprises a substrate 101 with electrical devices 103, a first dielectric layer 105 over the substrate 101, a conductive feature 107 within the first dielectric layers 105, a capping layer 109 over the conductive feature 107, a first etch stop layer 111, a second etch stop layer 113, a second dielectric layer 115, and a via opening 117.

In an embodiment, the substrate 101 comprises a crystalline silicon substrate (e.g., wafer), although other suitable elemental semiconductors, such as a suitable compound semiconductor (e.g., gallium arsenide, silicon carbide, indium arsenide, indium phosphide, or the like), or a suitable alloy semiconductor (e.g., silicon germanium carbide, gallium arsenic phosphide, or gallium indium phosphide), or the like, may also be used. Further, the substrate 101 may include an epitaxial layer (epi-layer), may be strained for performance enhancement, and/or may include a silicon-on-insulator (SOI) structure.

Furthermore, the substrate 101 may include other features. For example, the substrate may include various doped regions depending on design (e.g., p-type substrate or n-type substrate). For example, the doped regions may be doped with p-type dopants, such as boron or BF2, n-type dopants, such as phosphorus or arsenic, and/or combinations thereof. The doped regions may be configured for an n-type semiconductor device, or alternatively configured for a p-type semiconductor device.

The electrical devices 103 (represented in FIG. 1 by the box labeled 103) may comprise a wide variety of active devices such as transistors and the like and passive devices such as capacitors, resistors, inductors and the like that may be used to generate the desired structural and functional parts of the design. The active devices and passive devices may be formed using any suitable methods either within or else on the substrate 101. As an example, electrical devices 103 may include one or more transistors (not individually shown) formed in the Front-End-Of-Line (FEOL) processing of the semiconductor device 100. Although not shown in FIG. 1, contact plugs (not shown) may be formed in an interlayer dielectric layer (ILD) (not shown) over the electrical devices 103 and may be electrically coupled to, e.g., source/drain regions and the gates of the transistors.

The first dielectric layer 105, which may be referred to as a first metallization layer, is formed over the substrate 101 and the electrical devices 103. Conductive features such as conductive lines and vias are formed in the first metallization layer to connect various electrical devices 103 to form functional circuitry for the design. The first dielectric layer 105 may comprise silicon oxide, silicon nitride, low-k dielectrics such as carbon doped oxides, extremely low-k dielectrics such as porous carbon doped silicon dioxide, combinations of these, or the like, and may be formed through a process such as chemical vapor deposition (CVD), physical vapor deposition (PVD), or any other suitable deposition method.

The conductive feature 107 is formed in the first dielectric layer 105. The conductive feature 107 may be an electrically conductive line that is formed using an electrically conductive material such as copper, aluminum, tungsten, gold, combinations thereof, or the like. In the illustrated embodiment, the conductive feature 107 may additionally include a capping layer 109 formed thereon. Therefore, when the capping layer 109 is formed, the conductive feature 107 and the capping layer 109 may be collectively referred to as a metallization feature no.

In an embodiment, the conductive feature 107 may be formed of a material such as copper using, e.g., a damascene or dual damascene process, whereby an opening is formed within the first dielectric layer 105, the opening is filled and/or overfilled with a conductive material such as copper, and a planarization process, such as a chemical mechanical planarization (CMP) process, is performed to embed the conductive material within the first dielectric layer 105. However, any suitable material and any suitable process may be used to form the conductive feature 107.

Although not shown in FIG. 1, a diffusion barrier layer may be formed between the conductive feature 107 and the first dielectric layer 105. The diffusion barrier layer may comprise titanium nitride, although other materials, such as tantalum nitride, tantalum, titanium, or the like, may also be utilized. The diffusion barrier layer may be formed using a CVD process, such as plasma-enhanced CVD (PECVD). However, other alternative processes, such as sputtering or metal organic chemical vapor deposition (MOCVD), atomic layer deposition (ALD), may alternatively be used.

A capping layer 109 is formed on the exposed surface of the conductive feature 107 in accordance with an embodiment. The capping layer 109 extends from over the exposed surface of the conductive feature 107 to over the exposed surface of the diffusion barrier layer (not shown) in accordance with some embodiments. The capping layer 109 may be a metallization layer including cobalt (Co) or a Co-based alloy (such as CoWBP or CoWP). The capping layer 109 is employed to inhibit copper diffusion and migration. By an electroless plating process or an immersion plating process or a CVD process, the capping layer 109 is selectively formed on the exposed surfaces of the conductive feature 107 and/or the diffusion barrier layer. By using the electroless plating or the CVD process, the thickness of the capping layer 109 may be accurately controlled. In some embodiments, the capping layer 109 has a thickness about 0.1~10 μm. The capping layer 109 may be a single-layered structure, a dual-layered structure or a triple-layered structure. In some embodiments, the formation of capping layer 109 can provide good thermal stability and to avoid copper extrusion which may cause dielectric crack. In an exemplary embodiment, the conductive feature 107 is formed of copper, and the capping layer 109 is formed of cobalt.

Next, the first etch stop layer 111 is formed over the first dielectric layer 105 and the metallization feature no. The first etch stop layer 111 is used to protect the underlying structures and provide a control point for a subsequent etching process through, e.g., the second etch stop layer 113. In an embodiment, the first etch stop layer 111 may be formed of silicon nitride using PECVD, although other materials such as nitride, carbide, boride, combinations thereof, or the like, and alternative techniques of forming the first etch stop layer in, such as low pressure CVD (LPCVD), PVD, or the like, could alternatively be used. The first etch stop layer 111 may have a thickness of between about 10 angstroms and about 500 angstroms, such as about 200 angstroms.

Once the first etch stop layer in has been formed to cover the metallization feature no, the second etch stop layer 113 is formed over the first etch stop layer 111. In an embodiment, the second etch stop layer 113 is formed of a material such as aluminum oxide, although any suitable material, such as aluminum nitride, may also be used. The material of the second etch stop layer 113 may be formed using a deposition process such as CVD, PVD, ALD, or the like, and may be deposited to a thickness of between about 10 angstroms and about 200 angstroms, such as about 40 angstroms. However, any suitable process of formation and thickness may be utilized.

Once the second etch stop layer 113 has been formed, the second dielectric layer 115 may be formed over the second etch stop layer 113. The second dielectric layer 115 may comprise silicon oxide, silicon nitride, low-k dielectrics such as carbon doped oxides, extremely low-k dielectrics such as porous carbon doped silicon dioxide, combinations of these, or the like, and may be formed through a process such as CVD, PVD, or any other suitable deposition method. In an exemplary embodiment, each of the first dielectric layer 105 and the second dielectric layer 115 comprises a low-k dielectric material.

Next, the via opening 117 is formed. The via opening 117 may be formed by one or more suitable etching processes, such as one or more anisotropic etch processes. The anisotropic etch processes may be dry etch processes such as plasma etch processes. A mask layer (not shown), such as a photo resist layer, may be formed over the second dielectric layer 115 and patterned using, e.g., a photolithography and etching process. The patterned mask layer may then be used in the one or more etching processes (e.g., anisotropic etch processes) to form the via opening 117. As illustrated in FIG. 1, the via opening 117 is formed to extend through the second dielectric layer 115, the second etch stop layer 113, the first etch stop layer in, and the capping layer 109 to exposes the conductive feature 107. Sidewalls of the via opening 117 are illustrated in FIG. 1 as being slanted with respect to an upper surface 107U of the conductive feature 107, however, sidewalls of the via opening 117 may be perpendicular to the upper surface 107U of the conductive feature 107 in other embodiments. After the via opening 117 is formed, the patterned mask layer may be removed using a suitable removal process such as ashing.

Figure 2:
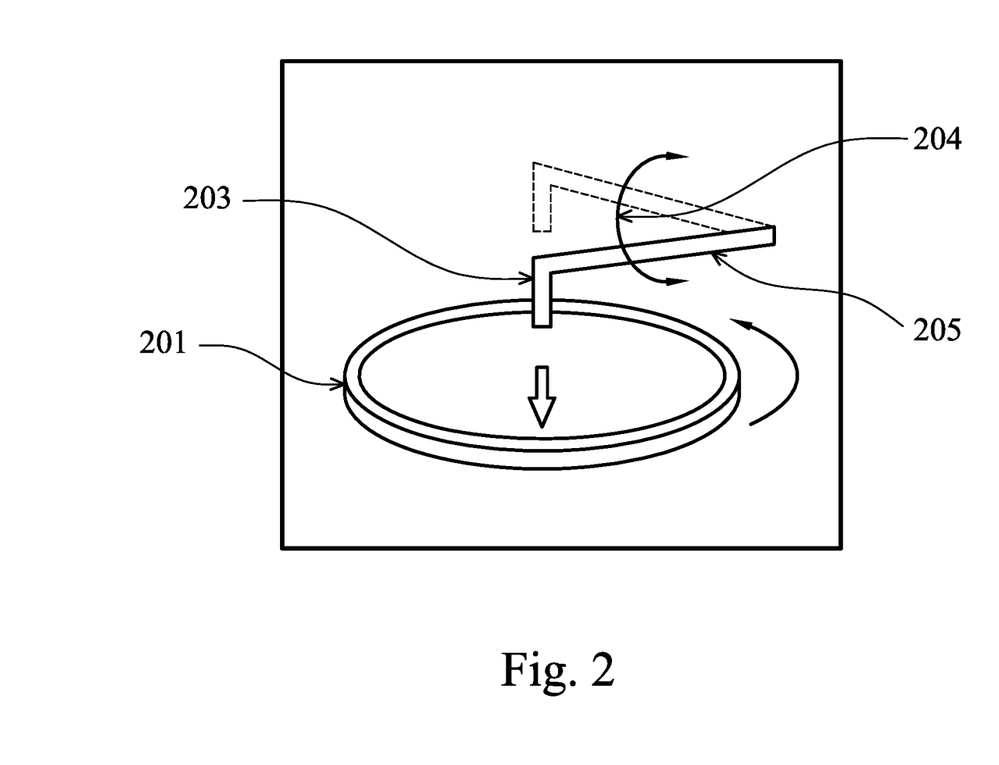
FIGS. 2-4 are schematic views showing cleaning, rinsing and drying, respectively, of a wafer comprising the semiconductor device illustrated in FIG. 1, in accordance with an embodiment.
Figure 3:
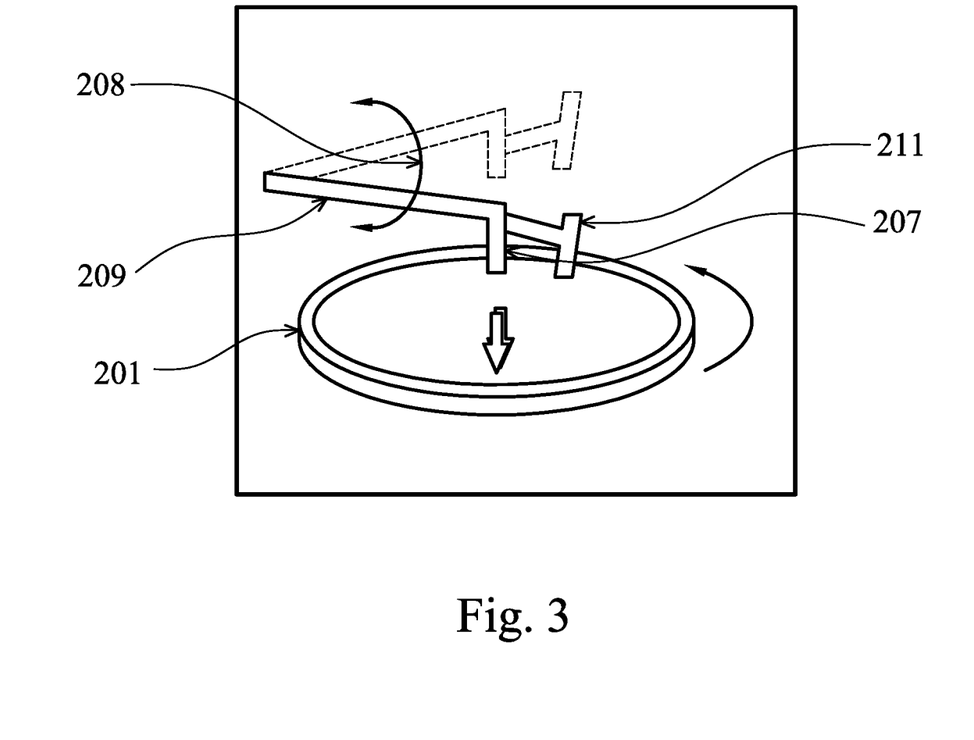
Figure 4:
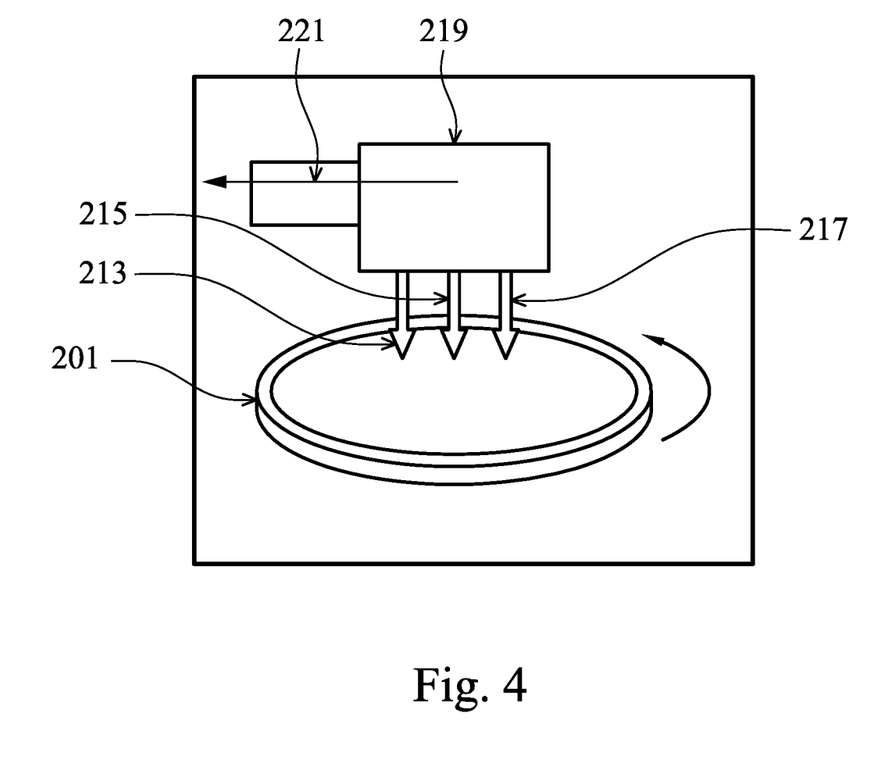

FIGS. 2-4 illustrate the cleaning, rinsing and drying of a wafer 201, respectively, in accordance with an embodiment of the present disclosure. The wafer 201 may include tens, hundreds, or more of the semiconductor device 100 illustrated in FIG. 1, and may be singulated later to form multiple individual semiconductor devices 100, as one of ordinary skill in the art readily appreciates.

Referring to FIG. 2, the via opening 117 (see FIG. 1) of each semiconductor device 100 of wafer 201 is cleaned by a via opening cleaning process before subsequent processing, such as the deposition of a barrier layer 121 (see FIG. 5) and a seed layer 123 (see FIG. 6), are performed. Cleaning of the via opening 117 removes contaminants and/or residues in the via opening 117, which contaminants and/or residues are produced from the previous processing steps. By removing the contaminants and/or residues from the via opening 117, the via opening cleaning process helps to improve the quality of subsequently formed barrier layer 121 and seed layer 123 in the via opening 117, thus improving the quality and reliable of the semiconductor device formed.

The via opening cleaning process uses a cleaning fluid. As illustrated in FIG. 2, the cleaning fluid is sprayed onto the wafer 201 to clean the via opening 117. The cleaning fluid is sprayed onto the wafer 201 through a port 203 disposed over the wafer 201, in some embodiments. The port 203 may be attached to an arm 205 that is controlled by a controller (not shown) to move across the surface of the wafer 201 along direction 204, e.g., to move from a center of the wafer 201 to an edge of the wafer 201, to cover all regions of the wafer 201. The wafer 201 may be rotating during the via opening cleaning process.

In some embodiments, the cleaning fluid is a chemical mixture comprising a solvent and a cleaning chemical. The solvent may be de-ionized water, poly ethylene glycol, butyl diethylene glycol, hexyl diethylene glycol, 4-methylmorpholine, 4-methylmorpholine N-oxide, dimethylsulfoxide, or a mixture thereof, in some embodiments. The cleaning chemical may be hydroxide, fluoride, hydrogen peroxide, or a mixture thereof, as examples. In some embodiments, an inhibitor, such as a copper inhibitor, is added to the chemical mixture to protect the conductive feature 107 from the via opening cleaning process. The inhibitor (e.g., a copper inhibitor) decreases the etching rate or corrosion rate of the conductive feature 107, in some embodiments.

In accordance with an embodiment, a flow rate of the chemical mixture during the via opening cleaning process may be between about 700 standard liters per minute (SLPM) to about 2800 SLPM, such as 1800 SLPM. A rotational speed of the wafer 201 during the via opening cleaning process may be between about 30 rounds per minute (RPM) to about 1000 RPM, such as 300 RPM, as an example. The via opening cleaning process may be performed for a duration between about 30 seconds and about 300 seconds, such as 180 seconds. In some embodiments, the cleaning process is performed at a temperature of between about 20° C. and about 80° C., such as 60° C. However, any suitable temperature may be applied.

Next, as illustrated in FIG. 3, the cleaning process is stopped, and a rinsing process is performed subsequently for the wafer 201. The rinsing process is performed using a rinsing fluid to rinse off residues and/or particles on the wafer 201 after the via opening cleaning process, in some embodiments. As illustrated in FIG. 3, the rinsing fluid is sprayed onto the wafer 201 through port 207 and/or port 211, which port 207 and port 211 may be attached to an arm 209 that is controlled by a controller (not shown) to move across the surface of the wafer 201 along direction 208, e.g., from the center of the wafer 201 to the edge of the wafer 201. In the illustrated example of FIG. 3, the port 211 represents another rinsing port in addition to the port 207, which port 211 injects nitrogen (e.g., N2) into the rinsing fluid (e.g., injected from the port 207) to reduce the size of the droplets of the rinsing fluid and to increase the velocity of the rinsing fluid for increased cleaning efficiency. In some embodiments, a flow rate of N2 is between about 5 SLPM and about 100 SLPM, such as 50 SLPM. The wafer 201 is rotating during the rinsing process, in the illustrated embodiment.

In an embodiment, the rinsing fluid comprises a solvent that has been doped to be alkaline. In a particular embodiment, the solvent is a fluid such as de-ionized water (DIW). However, any other suitable fluid, such as $CO_2$-dissolved DIW (e.g., DIW-$CO_2$), $O_2$-dissolved DIW (e.g., DIW-$O_2$), or combinations thereof, may also be used as the solvent.

However, rinsing with the DIW by itself (e.g., DIW without doping to be alkaline) may cause loss of the material of the conductive feature 107. As an example, consider the embodiment where the conductive feature 107 comprises copper and the capping layer 109 comprise cobalt. After a rinsing process using the DIW by itself as the rinsing fluid, the portion of the upper surface 107U of the conductive feature 107 exposed by the via opening 117 may recess below other portions of the upper surface 107U covered by the capping layer 109. Additionally, portions of the capping layer 109 and portions of the conductive feature 107 exposed by the via opening 117 may recess along the lateral direction of the metallization feature no. This phenomenon is referred to as copper recess in the discussion hereinafter. Although copper is used in the term "copper recess," the term "copper recess" is intended to cover similar phenomenon where a material other than copper is used for the conductive feature 107 and where the material suffers a recess due to a rinsing process using the DIW by itself as the rinsing fluid.

The copper recess may be caused by the chemical reaction between copper oxide (which occurs naturally at the upper surface 107U as copper reacts with oxygen in the ambient) and the DIW which tends to be acidic (e.g., having a pH value below 7) due to $CO_2$ and/or $O_2$ in the ambient being dissolved into the DIW. Another mechanism for the copper recess may be the via induced metal corrosion (VIMC). Without being limited to a particular theory of operation, it is believed that when the conductive feature 107 has a static charge (e.g., a static voltage), e.g., due to the rotation of the wafer 201 and frictions with the DIW, the metal (e.g., copper) at the surface of the conductive feature 107 may react with water and turn into metal ions (e.g., copper ions) and leave the conductive feature 107, thus causing corrosion of the conductive feature 107.

Embodiments of the present disclosure reduces or avoids the copper recess problem by using a basic-ion water (or basic-ion doped water) as the rinsing fluid for the rinsing process. The basic-ion water may be formed by doping the DIW with basic-ions, such that the basic-ion water is alkaline. Doping of the DIW may be achieved by adding one or more chemicals (may also be referred to as dopant(s)) into the DIW, which chemicals disassociate within the DIW and provides basic-ion(s) in the DIW after being added into the DIW. In an exemplary embodiment, ammonium hydroxide (e.g., $NH_4OH$) is added into the DIW and disassociates to produce $NH_4^+$ and $OH^-$ ions in the DIW, where the $OH^-$ ions act as the basic-ions. Other suitable chemicals, such as ammonium hydrogen carbonate, ammonium carbonate, ammonium acetate, combinations thereof, or the like, may also be used to dope the DIW to produce basic-ion waters.

In some embodiments, a concentration of the chemical(s) in the DIW, after the chemical(s) are mixed in the DIW, is in a range between about 0.5 parts per million (ppm) and about 10000 ppm, although any suitable concentration may be utilized. In other embodiments, the concentration of the chemical(s) in the DIW is in a range between about 1 ppm and 1000 ppm. In yet other embodiments, the concentration of the chemical(s) in the DIW is in a range between about 3 ppm and about 100 ppm, such as 10 ppm.

Additionally, the concentration of the chemical(s) may be adjusted to achieve a target pH value for the basic-ion water. In an exemplary embodiment, the pH value of the basic-ion water is greater than about eight. In other embodiments, the pH value of the basic-ion water is between about 9 and about 11. In yet another embodiment, the pH value of the basic-ion water is between about 9.5 and about 10.

Due to the ions in the basic-ion water, a conductivity of the basic-ion water is between about 1 micro-Siemens per centimeter (µS/cm) and about 1000 µS/cm, in some embodiments. In other embodiments, the conductivity of the basic-ion water is between about 1 µS/cm and about 300 µS/cm. In another embodiment, the conductivity of the basic-ion water is between about 3 µS/cm and about 60 µS/cm. In comparison, the conductivity of the DIW is about 0.055 µS/cm.

In some embodiments, the rinsing process is performed at room temperature (e.g., between about 20° C. and 26° C.) using the basic-ion water as the rinsing fluid, although higher temperature (e.g., between about 26° C. and 80° C.) may also be utilized. A flow rate for the basic-ion water may be between about 600 SLPM and 2000 SLPM, although other values may also be possible. The rinsing process may be performed for a duration between about 5 seconds and 120 seconds, such as 15 seconds. In an exemplary embodiment, the rinsing process is performed for about 10 seconds or longer. A rotational speed of the wafer 201 during the rinsing process may be between about 30 RPM to about 1000 RPM, such as 200 RPM, as an example.

By using the basic-ion water as the rinsing fluid, copper recess is reduced or avoided. Since the basic-ion water is alkaline, the chemical reaction between copper oxide at the surface of the conductive feature 107 and an acidic rinsing fluid is avoided or reduced. In addition, the conductivity of the basic-ion water is improved due to the ions (e.g., $NH_4^+$ and $OH^-$ ions) in the basic-ion water. The improved conductivity helps to reduce the static charge accumulated on the wafer 201 when the wafer 201 is rotated and rubbed against the basic-ion water. Reducing the static charge in turn reduces the corrosion of the conductive feature 107 (e.g., due to via induced metal corrosion).

Furthermore, the basic-ion water, which has a pH value greater than about eight, produces a negative zeta-potential at the surface of the wafer 201. Since particles, such as contaminants and/or residues on the surface of the wafer 201 tend to have negative charge, the negative zeta-potential helps to repel the particles from the surface of the wafer 201, thus achieving better rinsing results. The presently disclosed method also allows for longer rinsing time for thorough rinsing of the via openings with little or no copper recess. Experiments using the disclosed method herein have demonstrated reduced copper recess compared with a method using the DIW by itself as the rinsing fluid. For example, compared with a method using the DIW by itself as the rinsing fluid, the amount of copper recess is reduced from about 4.4 nm to about 3.0 nm, achieving over 30% reduction by using the basic-ion water with a concentration of $NH_4OH$ in DIW of 2 ppm as the rinsing fluid.

Next, as illustrated in FIG. 4, the wafer 201 is dried by a drying process. A drying head 219 with three ports is used for the drying process in the example of FIG. 4. As illustrated in FIG. 4, the drying head 219 has a first port 213 for dispensing (e.g., spraying) the rinsing fluid (e.g., basic-ion water), a second port 215 for dispensing isopropyl alcohol (IPA), and a third port 217 for dispensing nitrogen. The drying head 219 may be controlled by a controller (not shown) to move, e.g., from the center of the wafer 201 to the edge of the wafer 201 along direction 221. The wafer 201 may be rotating during the drying process.

In some embodiments, the first port 213 sprays the basic-ion water onto the wafer 201 for a pre-determined amount of time (e.g., 1 second to 20 seconds) while the first port 213 is disposed over a center region of the wafer 201. A flow rate of the basic-ion water is between about 600 SLPM and about 2000 SLPM, in some embodiments. The drying head 219 is stationary (e.g., remains over the center region of the wafer 201) during the spraying of the basic-ion water, in some embodiments. The spraying of the basic-ion water during the drying process may follow shortly after the rinsing process illustrated in FIG. 3 is stopped to prevent the rinsing fluid from drying up on the wafer 201 and forming a dried-up film of the rinsing fluid, in some embodiments. In other embodiments, the spraying of the basic-ion water may be a final stage of the rinsing process, in which case the drying head 219 may be used for dispensing the basic-ion water during the rinsing process illustrated in FIG. 3 as well.

Next, spraying of the basic-ion water is stopped, and the port 215 sprays IPA or other suitable solvent onto the wafer 201 while the port 217 sprays nitrogen onto the wafer 201. In other words, both IPA and nitrogen are directed onto the wafer 201 by the ports 215 and 217. The drying head 219 moves from the center region of the wafer 201 toward the edge region of the wafer 201 while the IPA and nitrogen are directed onto the wafer 201. In some embodiments, a flow rate of IPA is between about 100 SLPM and about 300 SLPM, and a flow rate of nitrogen is between about 0 SLPM and about 50 SLPM. A duration of the spraying of the IPA and nitrogen may be between about 5 seconds and 60 seconds. The wafer 201 is rotating at a rotational speed in a range between about 200 RPM and 1700 RPM, in some embodiments.

Figure 5:
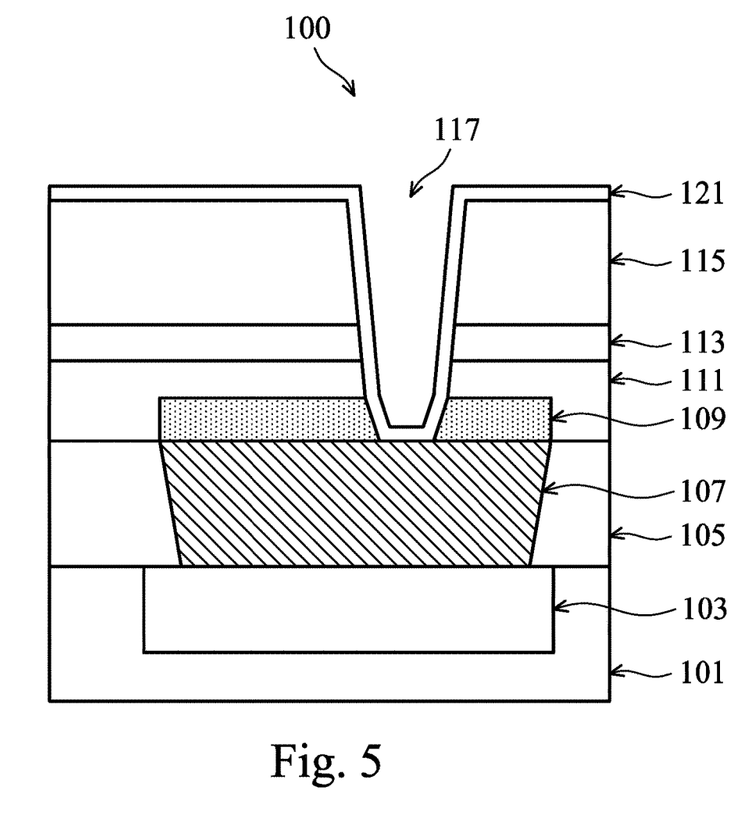
FIGS. 5-8 illustrate cross-sectional views of the semiconductor device illustrated in FIG. 1 at various stages of fabrication, in accordance with an embodiment.

After the wafer 201 is processed by the drying process of FIG. 4, processing of the semiconductor device 100 continues as illustrated in FIG. 5, where a barrier layer 121 is conformally formed over the via opening 117. The barrier layer 121 may comprise titanium nitride, tantalum nitride, titanium, tantalum, or the like, and may be formed using a CVD process, such as PECVD. However, other processes, such as sputtering, MOCVD, or ALD, may alternatively be used. The barrier layer 121 may be formed to line the sidewalls and the bottom of the via opening 117. The barrier layer 121 may also be formed over the upper surface of the second dielectric layer 115.

Figure 6:
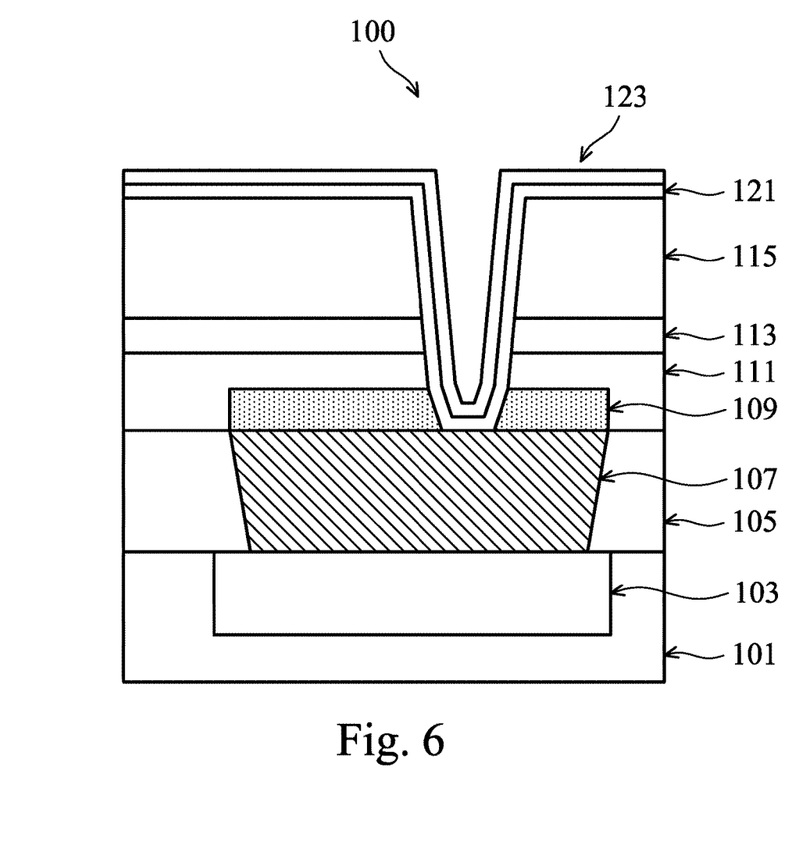

Next, as illustrated in FIG. 6, a seed layer 123 is disposed over the barrier layer 121. The seed layer 123 may include copper, titanium, tantalum, titanium nitride, tantalum nitride, the like, or a combination thereof, and may be deposited by ALD, sputtering, PVD, or the like. In some embodiments, the seed layer is a metal layer, which may be a single layer or a composite layer comprising a plurality of sub-layers formed of different materials. In some embodiments, the seed layer comprises a titanium layer and a copper layer over the titanium layer.

Figure 7:
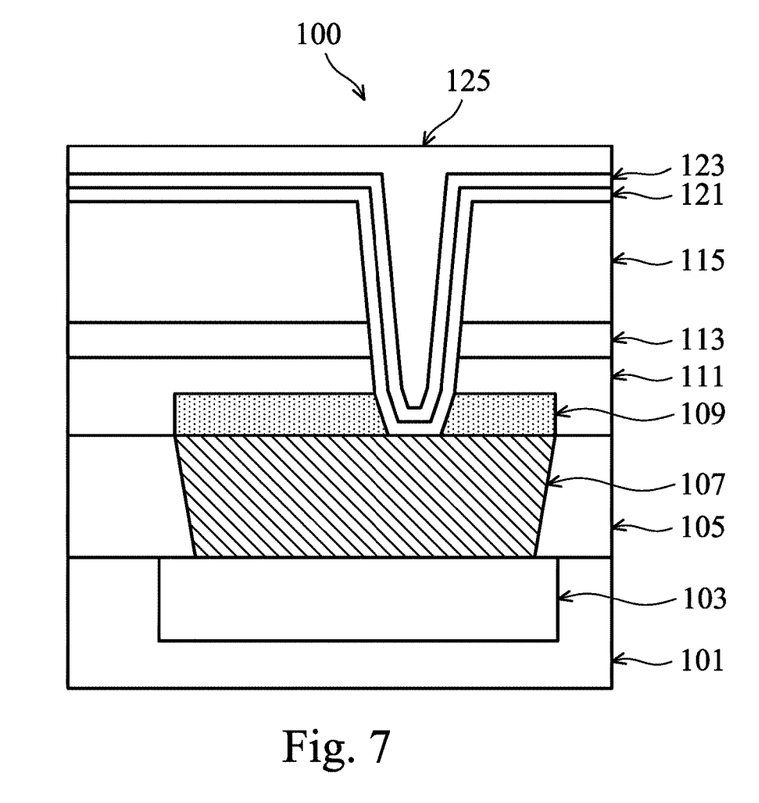

Next, as illustrated in FIG. 7, the via opening 117 is filled with a conductive material 125. The conductive material 125 may comprise copper, although other suitable materials such as aluminum, tungsten, cobalt, alloys, combinations thereof, and the like, may alternatively be utilized. The conductive material 125 may be formed by plating, e.g., electroplating copper onto the seed layer 123, filling and overfilling the via openings 117.

Figure 8:
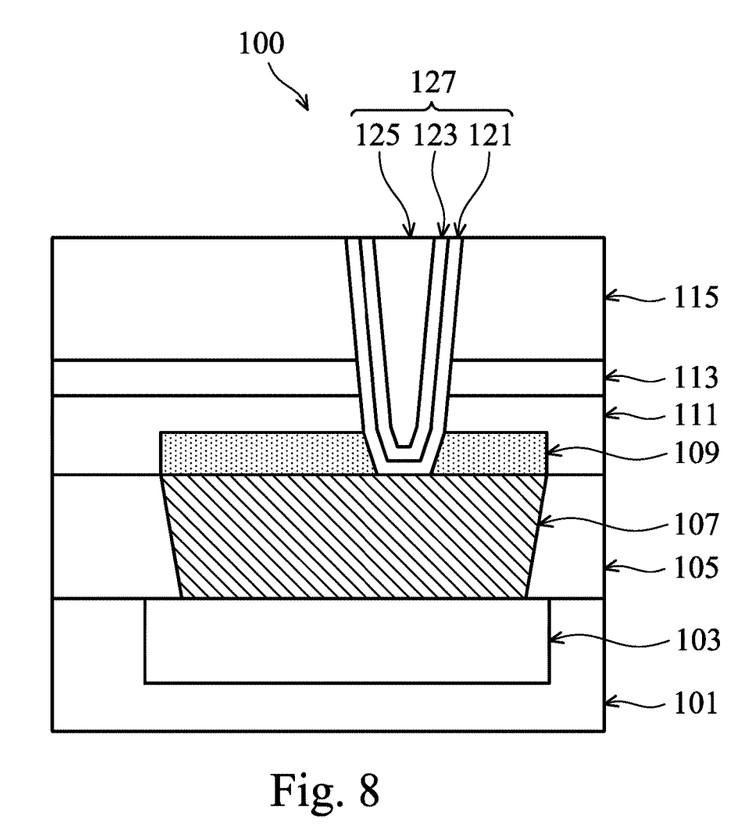

Once the via openings 117 has been filled, excess barrier layer 121, excess seed layer 123 and excess conductive material 125 outside of the via openings 117 may be removed through a grinding process such as CMP, as illustrated in FIG. 8, although any suitable removal process may be used. Contact plug 127, which includes the barrier layer 121, the seed layer 123 and the conductive material 125, is formed in the via opening 117.

Additional processing steps may be needed to finish the fabrication of the semiconductor device 100, as readily appreciated by one skilled in the art. For example, additional dielectric layers, conductive features and vias may be formed over the second dielectric layer 115.

Figure 9:
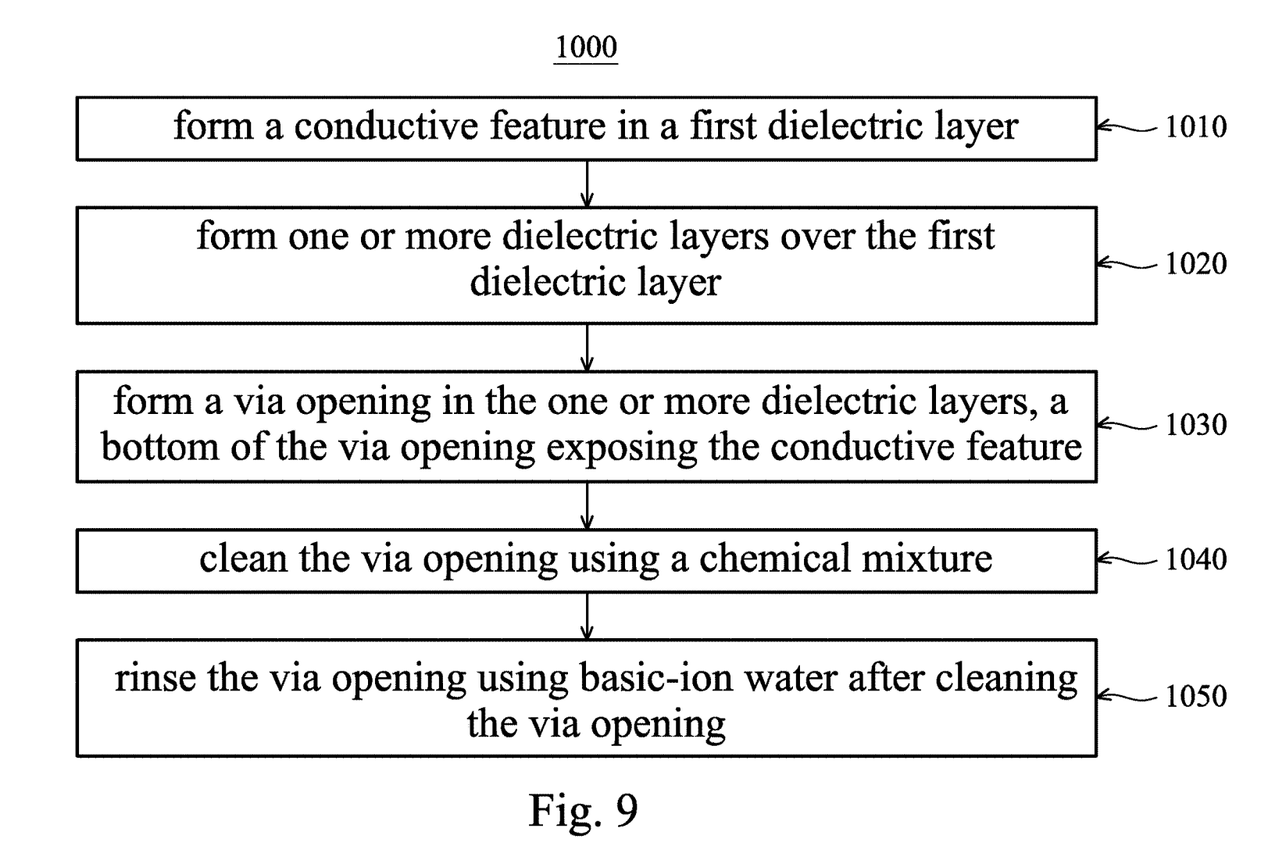
FIG. 9 is a flow chart of a method for forming a semiconductor device, in accordance with some embodiments.

FIG. 9 illustrates a flow chart of a method of fabricating a semiconductor device, in accordance with some embodiments. It should be understood that the embodiment method shown in FIG. 9 is merely an example of many possible embodiment methods. One of ordinary skill in the art would recognize many variations, alternatives, and modifications. For example, various steps as illustrated in FIG. 9 may be added, removed, replaced, rearranged and repeated.

Referring to FIG. 9, at step 1010, a conductive feature is formed in a first dielectric layer. At step 1020, one or more dielectric layers are formed over the first dielectric layer. At step 1030, a via opening is formed in the one or more dielectric layers, a bottom of the via opening exposing the conductive feature. At step 1040, the via opening is cleaned using a chemical mixture. At step 1050, the via opening is rinsed using basic-ion water after cleaning the via opening.

Embodiments may achieve advantages. For example, due to the use of basic-ion water as the rinsing fluid, copper recess is reduced or prevented. The ions in the basic-ion water help to conduct static electricity away from the wafer 201 during the rinsing process, thus reducing or preventing static charge from being accumulated on the wafer 201, which in turn reduces the copper recess as well as reduces any damage to the wafer 201 due to high static charge. The basic-ion water also provides a negative-zeta potential on the wafer 201, which helps to repel particles on the surface of the wafer 201, thus achieving a better rinsing results. As a result, the subsequently formed barrier layer and seed layer having better qualities, which improves the reliability of the semiconductor device formed.

In some embodiments, a method of forming a semiconductor device includes forming a conductive feature in a first dielectric layer, forming one or more dielectric layers over the first dielectric layer, and forming a via opening in the one or more dielectric layers, a bottom of the via opening exposing the conductive feature. The method further includes cleaning the via opening using a chemical mixture, and rinsing the via opening using basic-ion doped water after cleaning the via opening.

In some embodiments, a method a forming a semiconductor device includes forming a first dielectric layer, forming a conductive feature in the first dielectric layer, and forming a second dielectric layer over the first dielectric layer. The method also includes forming an opening in the second dielectric layer, the opening exposing the conductive feature, and cleaning the opening. The method further includes stopping cleaning the opening, and after stopping cleaning the opening, rinsing the opening using a water with one or more dopants, the water with one or more dopants having a pH value greater than about eight.

In some embodiments, a method includes receiving a basic-ion doped water, and applying the basic-ion doped water to a semiconductor device having a via opening, where the via opening is formed in one or more dielectric layers over a substrate, where the via opening exposes a conductive feature in a second dielectric layer underlying the one or more dielectric layers. The method further includes removing the basic-ion doped water from the semiconductor device.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a semiconductor device comprising:
forming a conductive feature in a first dielectric layer;
forming one or more dielectric layers over the first dielectric layer;
forming a via opening in the one or more dielectric layers, a bottom of the via opening exposing the conductive feature;
cleaning the via opening using a chemical mixture;
rinsing the via opening using basic-ion doped water after cleaning the via opening, wherein a conductivity of the basic-ion doped water is between about 1 micro-Siemens per centimeter ($\mu$S/cm) and about 1000 $\mu$S/cm; and
drying the via opening after rinsing the via opening, wherein drying the via opening comprises:
spraying the basic-ion doped water onto the semiconductor device using a first port of a drying head;
stopping spraying the basic-ion doped water; and
spraying isopropyl alcohol (IPA) and nitrogen onto the semiconductor device, wherein the IPA is sprayed using a second port of the drying head, and the nitrogen is sprayed using a third port of the drying head different from the second port.

2. The method of claim 1, further comprising forming a capping layer over the conductive feature, wherein the capping layer is between the conductive feature and the one or more dielectric layers.

3. The method of claim 2, wherein forming the via opening removes portions of the capping layer and exposes the conductive feature.

4. The method of claim 1, wherein the basic-ion doped water reduces a static charge of the semiconductor device.

5. The method of claim 1, further comprising forming the basic-ion doped water by adding a chemical that provides basic-ions to de-ionized water (DIW).

6. The method of claim 5, wherein a concentration of the chemical in DIW is in a range from about 0.5 parts per million (ppm) to about 10000 ppm.

7. The method of claim 1, wherein rinsing the via opening is performed for a duration between about 5 seconds and about 120 seconds.

8. The method of claim 1, wherein cleaning the via opening is performed at a temperature between about 20° C. and about 80° C.

9. The method of claim 1, wherein the basic-ion doped water is formed by doping de-ionized water with ammonium hydroxide, ammonium hydrogen carbonate, ammonium acetate, or ammonium carbonate.

10. The method of claim 1, wherein a concentration of a dopant in the basic-ion doped water is between about 1 part per million (ppm) and about 1000 ppm.

11. A method of forming a semiconductor device comprising:
forming a first dielectric layer;
forming a conductive feature in the first dielectric layer;
forming a second dielectric layer over the first dielectric layer;
forming an opening in the second dielectric layer, the opening exposing the conductive feature;
cleaning the opening;
stopping cleaning the opening;
after stopping cleaning the opening, rinsing the opening using a water with one or more dopants, the water with one or more dopants having a pH value greater than about eight; and
after rinsing the opening, drying the semiconductor device using isopropyl alcohol (IPA) and nitrogen ($N_2$), wherein the IPA and the $N_2$ are sprayed on the semiconductor device simultaneously using a first port of a drying head and a second port of the drying head, respectively.

12. The method of claim 11, wherein cleaning the opening and rinsing the opening are performed at a temperature between about 20° C. and about 80° C.

13. The method of claim 11, wherein the one or more dopants comprise basic-ions.

14. The method of claim 11, wherein the water with one or more dopants is formed by doping de-ionized water with a chemical selected from the group consisting essentially of ammonium hydroxide, ammonium hydrogen carbonate, ammonium acetate, ammonium carbonate, and combinations thereof.

15. The method of claim 11, wherein cleaning the opening is performed using a cleaning fluid comprising a solvent and a cleaning chemical, wherein the cleaning chemical is selected from the group consisting essentially of hydroxide, fluoride, hydrogen peroxide, and combinations thereof.

16. A method comprising:
receiving a basic-ion doped water;
applying the basic-ion doped water to a semiconductor device comprising a via opening, wherein the via opening is formed in one or more dielectric layers over a substrate, wherein the via opening exposes a conductive feature in a second dielectric layer underlying the one or more dielectric layers; and
removing the basic-ion doped water from the semiconductor device, wherein removing the basic-ion doped water comprises drying the semiconductor device by spraying isopropyl alcohol (IPA) and nitrogen ($N_2$) from a first port and a second port of a drying head, respectively, on the semiconductor device.

17. The method of claim 16, wherein applying the basic-ion doped water is performed at a temperature between 20° C. and 80° C.

18. The method of claim 17, wherein applying the basic-ion doped water is performed for a duration of 5 seconds or longer.

19. The method of claim 16, wherein the basic-ion doped water comprises $NH_4^+$ and $OH^{31}$ ions.

20. The method of claim 16, wherein a conductivity of the basic-ion doped water is in a range from about 1 microSiemens per centimeter (μS/cm) to about 1000 μS/cm.

* * * * *